(12) United States Patent
Laitinen et al.

(10) Patent No.: US 7,455,532 B2
(45) Date of Patent: Nov. 25, 2008

(54) ELECTRONIC COMPONENT PIN CONNECTORS

(75) Inventors: Timo T. Laitinen, Viiala (FI); Matti Uusimäki, Pirkkala (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/335,011

(22) Filed: Jan. 18, 2006

(65) Prior Publication Data

US 2006/0172573 A1    Aug. 3, 2006

(51) Int. Cl.
*H01R 12/00* (2006.01)
(52) U.S. Cl. .................. 439/69; 361/734; 439/620.2
(58) Field of Classification Search .................. 439/59, 439/62, 69, 607, 620.15, 620.2, 630; 361/734, 361/763, 785, 811, 818
See application file for complete search history.

(56) References Cited

U.S. PATENT DOCUMENTS

| | | | | |
|---|---|---|---|---|
| 4,356,532 A | * | 10/1982 | Donaher et al. | 361/734 |
| 5,014,160 A | * | 5/1991 | McCoy, Jr. | 361/818 |
| 5,069,629 A | * | 12/1991 | Johnson | 439/71 |
| 5,309,324 A | * | 5/1994 | Herandez et al. | 361/734 |
| 5,902,152 A | * | 5/1999 | Robert | 439/620.21 |

FOREIGN PATENT DOCUMENTS

| | | |
|---|---|---|
| EP | 0407072 A1 | 1/1991 |
| GB | 2269940 A | 2/1994 |

* cited by examiner

*Primary Examiner*—Khiem Nguyen
(74) *Attorney, Agent, or Firm*—Foley & Lardner, LLP

(57) ABSTRACT

An electronic component pin connector comprising a non-conductive housing with a substrate end and an electronic component connection end,
the housing comprising one or more electrical contacts, the or each electrical contact extending from the substrate end to the component connection end to provide one or more electrical contact points to a substrate at the substrate end and one or more electrical contact points for a electronic component at the component connection end,
the housing comprising a filter aperture extending from the component connection end to the substrate end, the aperture dimensioned to house one or more filters in an electrically connected position to provide filtering of signalling between a substrate connected at the substrate end and a electronic component connected at the component connection end.

33 Claims, 6 Drawing Sheets

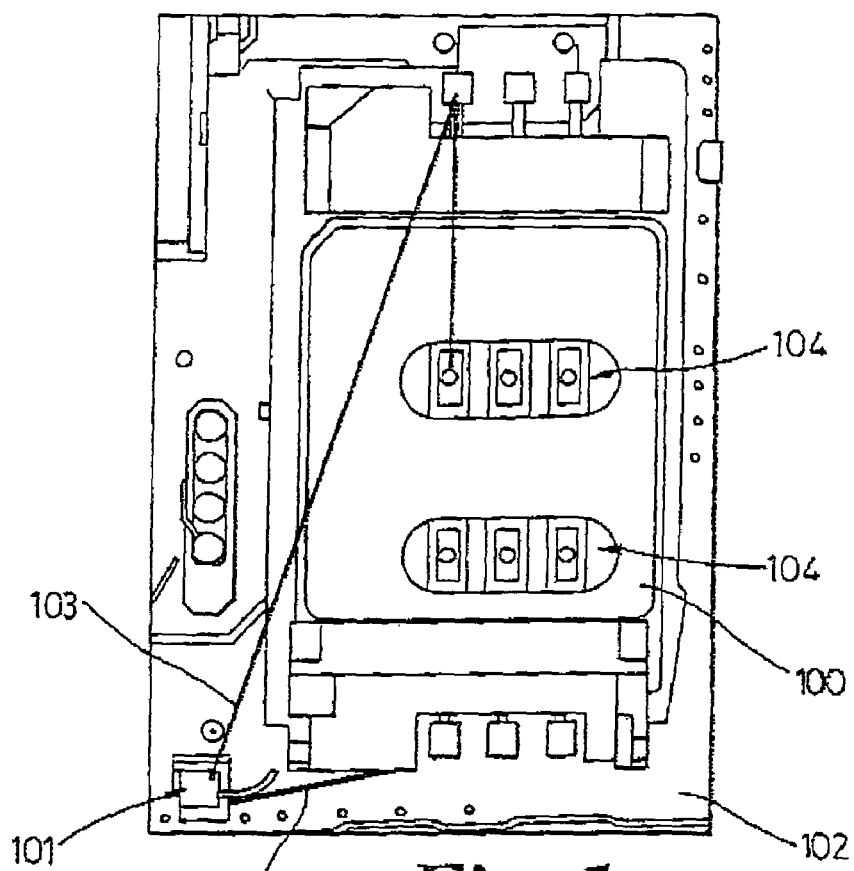
Fig. 1
(PRIOR ART)
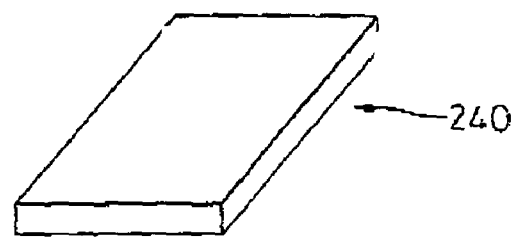
Fig. 4
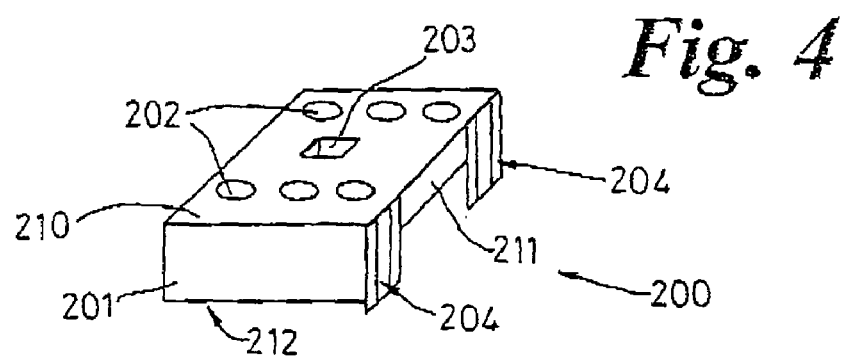

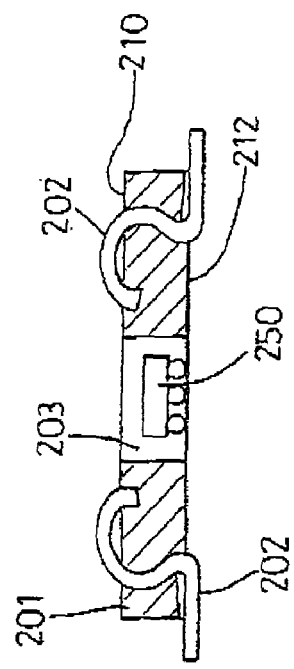
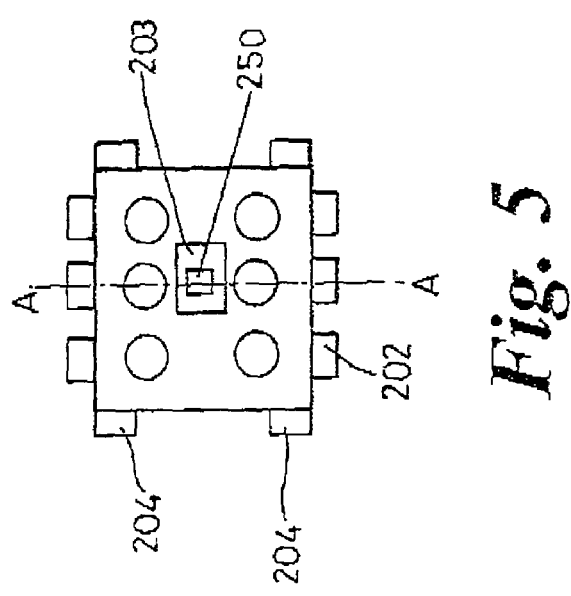
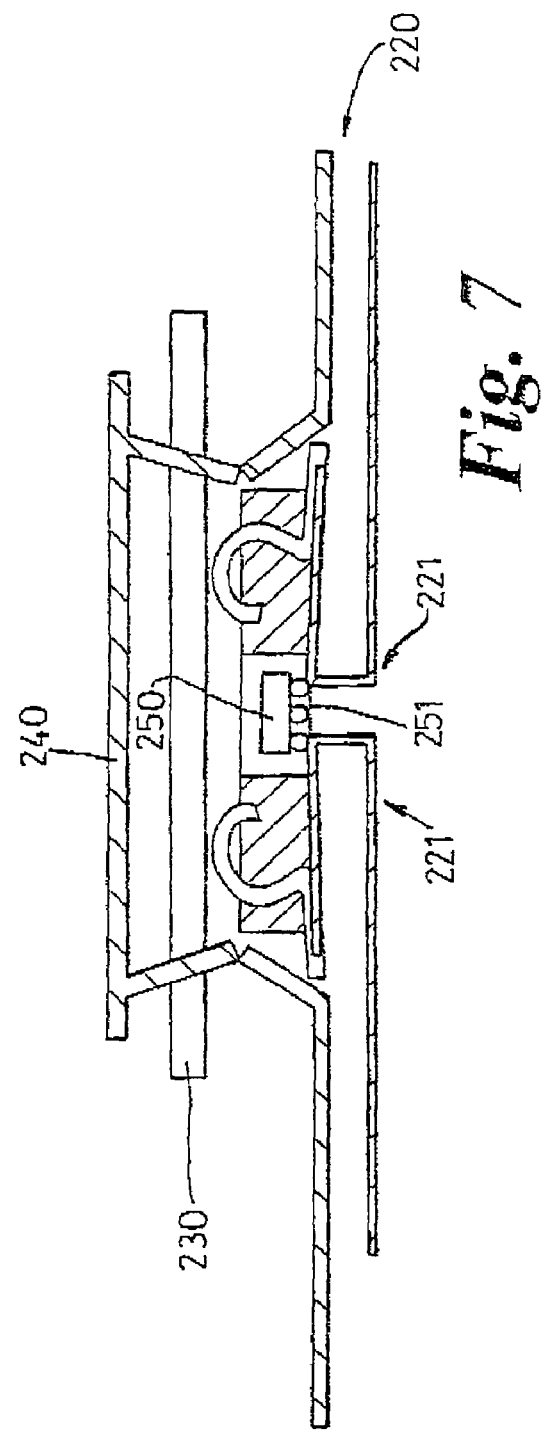

ELECTRONIC COMPONENT PIN CONNECTORS

FIELD OF THE INVENTION

The present invention relates to electronic component pin connectors used to connect electronic components having one or more connection pins to circuitry on a Printed Circuit Board (PCB)/substrate by virtue of inter-connection provided by the connector. The electronic components may, for example, be camera modules, memory cards, or SIM cards. The electronic components may, or may not, require soldering of the component pins to connector pins.

Embodiments of the present invention relate to electronic memory card technology, and provide improvements to electronic memory card connectors. The improved electronic memory card connectors provide associated benefits for memory cards and electronic devices using the memory cards. The memory connectors/cards include but are not limited to, those suitable for Multimedia, Secure Digital (MMC and SD) and Memory Stick formats. The electronic memory cards may include one or more integrated circuits (ICs) and these are often referred to as IC cards.

Subscriber Identification Module (SIM) cards, used in communications devices, are often referred to as IC cards. Embodiments of the present invention relate to improvements in SIM card connectors used in, for example, mobile phones, and provide associated benefits for SIM cards. In particular, certain embodiments of the present invention provide benefits for use of SIM cards manufactured using shrinked dies, and those which operate using comparatively low voltages (e.g. 1.8V used for SIM cards presently), for which electromagnetic interference from external sources becomes increasingly significant.

Although the scope of the invention is not limited to SIM card technology, the foregoing text will focus on such technology for ease of understanding.

BACKGROUND TO THE INVENTION

Interference of electronic circuitry caused by electromagnetic radiation is a known problem. In the case of SIM cards, the interference may be from low frequency base-band noise (e.g. of the order or several hundred kHz) or RF feeding (e.g. of the order to thousands of MHz) from the antenna back to the handset. Shielding of SIM cards to reduce the effect of such radiation is known e.g. GB2269940.

Filters are often used in electronic memory card connectors to prevent interference from affecting correct operation of the electronic memory cards, and the electronic devices to which they are connected. FIG. 1 shows an Application Specific Integrated Parts (ASIP) filter 101 provided in such a capacity for a SIM card connector 100, positioned on the surface of a printed circuit board 102. The ASIP filter 101 is connected, via tracks 103 (only some shown) to each of the SIM card connector contacts 104. This provides filtering to each of the SIM card connector contacts, and thus in turn to the SIM card (not shown).

The tracks 103 connecting the filter 101 to each of the SIM card contacts 104 act as antennae, particularly at high frequencies (1-2 GHz typical cellular radio operating frequency). This can cause noise to be present in the tracks which, via the SIM card contact pins 104, may affect the operation of the SIM card. As SIM card operating voltages reduce, increasingly smaller amounts of noise can be found to affect performance. This is because the noise represents a bigger proportion of the overall signal.

The SIM connector pins 104 may also pick up noise as they also can act like antennae. If this noise is not filtered then the noise will penetrate inside the phone and may cause the IC inside the phone to fail. Also, Electrostatic Discharge (ESD) can penetrate inside the phone and may cause failure of the phone IC.

SUMMARY OF THE PRESENT INVENTION

In a first aspect, the present invention provides an electronic component pin connector comprising a non-conductive housing with a printed circuit board end and an electronic component connection end, the housing comprising one or more electrical contacts, the or each electrical contact extending from the circuit board end to the component connection end to provide one or more electrical contact points for a printed circuit board at the circuit board end and one or more electrical contact points for a electronic component at the component connection end, the housing comprising a filter aperture extending from the component connection end to the printed circuit end, the aperture dimensioned to house one or more filters in an electrically connected position to provide filtering of signalling between a printed circuit board connected at the printed circuit board end and a electronic component connected at the card connection end.

The or each filter is thus essentially within the footprint of the connector. With the electrical contacts also being within the footprint of the connector, such an arrangement inherently provides for a comparatively small distance between the or each filter and the electrical contacts. This would provide reduced interference than in arrangements with comparatively long connection paths between the filter and the or each electrical contacts.

A compact design is also provided. The aperture allows visual access to check for the presence of the or each filter. The aperture can also provide for the checking of faults in the soldering of the filter to the printed circuit board (PCB). This may be by seeing that the filter is not in the proper position or by using X-ray analysis of the soldering.

The aperture may provide for repair/replacement of the filter. This may be by using an Infra-Red Ball Grid Array (BGA) package replacement station.

Preferably, the housing comprises a plurality of electrical contacts and the aperture is positioned to minimise the distance between any one contact and the or each filter placed within the aperture. This minimises the maximum track length between a filter and any one electrical contact.

Preferably, the housing comprises a plurality of electrical contacts and the aperture is positioned to provide an equidistant distance from each of the plurality of electrical contacts and a filter placed in the aperture. This minimises the maximum track length between a filter and any one electrical contact in certain arrangements of electrical contact points.

Preferably, the housing comprises a plurality of electrical contacts arranged in a symmetrical manner and the aperture is positioned to minimise the distance between the or each filter and each electrical contact. This may be by providing the aperture at the centre of arrangement of electrical contacts. For example, the aperture may be positioned in the centre of a square, rectangular, pentagonal, hexagonal, octagonal or circular arrangement of electrical contacts.

Specifically, there may be two, three, four, five, six, seven, eight, nine or ten or more electrical contacts. The relative position of the aperture and the electrical contacts may be the relative position of the aperture and the component end contact points. The relative position may be the relative position of the aperture and the circuit board end contact points.

Preferably, the aperture is dimensioned to house a single filter, the single filter arranged to provide filtering to each of the electrical contacts.

The aperture may be dimensioned to house one or more filters housed in a single housing, e.g. an ASIP, each filter being associated with a pin contact.

Preferably, the aperture is positioned within a central region of the housing. More preferably, within the centre of the housing.

Preferably, the aperture is square and may have dimensions of the order of 2 mm×2 mm, 3 mm×3 mm or therebetween. The aperture may be circular and may have a radius of the order of 1 mm, 2 mm or therebetween.

Preferably, the shape of the aperture is the shape of the filter. Preferably, the aperture is larger than the filter, but may be smaller than the filter.

In a preferred embodiment, the thickness of the housing through which the aperture extends is less than the length and/or width of the housing. Alternatively, the thickness of the housing though which the aperture extends may be greater, or similar, to the length and/or width of the housing.

Preferably, the connector is arranged to provide electromagnetic shielding. The aperture of the connector allows the positioning of the filter within the footprint of a shielded connector. Accordingly, shielding is also provided to the filter and the tracks to/from the filter, and thus provides reduced noise interference.

Preferably, the connector is arranged to provide shielding by comprising one or more conductive shield covers and one or more conductive ground lines, wherein the or each ground line is arranged to provide connection from one or more electrically ground positions on a printed circuit board to the component connection end to make contact with the or each conductive shield housing cover.

In a preferred embodiment, the connector is arranged to provide electromagnetic shielding, the connector comprising one or more conductive shield covers comprising holes in the cover, and wherein the holes are aligned to overlie the component end contact points. This allows testing access to the component end contact points without having to open the cover.

Preferably, the conductive shield housing cover is used to place the component into a firm engaged position with the connector component end contact points. This may be by a locking arrangement having a conductive shield cover which is arranged to slide to hold the component into position. The locking arrangement may comprise a conductive shield cover which is arranged to pivot from a non-locking position into a locking position. The shield cover may comprise a conductive grid/mesh arrangement.

The conductive shield cover may be formed on an exterior surface of the electronic component, which may be a memory card.

The connector may arranged to provide electromagnetic shielding by the use of a shield cover and the shield cover may be provided by a rear portion of the electronic component, the rear portion comprising a mesh arranged such that the gaps in the mesh overlie the connector component end contact points.

The electronic component may be an electronic memory card.

The or each ground line may be positioned on an exterior surface of the housing.

In a preferred embodiment, the connector is arranged to provide electromagnetic shielding by comprising one or more fully detachable conductive shield covers arranged to connect with one or more ground lines, the or each ground line arranged to provide connection from one or more electrically ground positions on a printed circuit board to the component connection end to make contact with the or each conductive shield housing cover.

The ground line may be a collar around the perimeter of the housing. The or each conductive shield cover may comprise one or more resiliently biased connection arms to engage with the or each ground line. The or each conductive shield cover may comprise an aperture for the insertion of one or more electronic memory cards.

Preferably, the connector is arranged to connect a SIM card for a mobile phone. The connector may be arranged to connect a memory card of MMC/SD, Memory Stick or Compact Flash format. The connector may connect a camera module.

In a second aspect, the present invention provides a printed circuit board comprising a electronic component pin connecter, the electronic component pin connector comprising a non-conductive housing with a printed circuit board end and an electronic component connection end, the housing comprising one or more electrical contacts, the or each electrical contact extending from the circuit board end to the component connection end to provide one or more electrical contact points for a printed circuit board at the circuit board end and one or more electrical contact points for a electronic component at the component connection end, the housing comprising a filter aperture extending from the component connection end to the printed circuit end, the aperture dimensioned to house one or more filters in an electrically connected position to provide filtering of signalling between a printed circuit board connected at the printed circuit board end and a electronic component connected at the component connection end.

In a third aspect, the present invention provides a method for assembling a electronic component pin connector onto a printed circuit board comprising electrically connecting one or more filters onto a printed circuit board to provide filtering to the electrical contacts of a electronic component, and assembling a electronic component pin connector over the or each filter, the connector comprising a non-conductive housing with a printed circuit board end and an electronic component connection end, the housing comprising one or more electrical contacts, the or each electrical contact extending from the circuit board end to the component connection end to provide one or more electrical contact points for a printed circuit board at the circuit board end and one or more electrical contact points for a electronic component at the component connection end, the housing comprising a filter aperture extending from the component connection end to the printed circuit end, the aperture dimensioned to house one or more filters in an electrically connected position to provide filtering of signalling between a printed circuit board connected at the printed circuit board end and an electronic component connected at the component connection end, and wherein the filter aperture is positioned over of the or each filter.

In a fourth aspect, there is provided an electronic device comprising a electronic memory card connector according to the present invention.

In a fifth aspect, there is provided an electronic device comprising a printed circuit board, an electronic memory card and an electronic memory card connector according to the present invention.

The present invention provides preferred embodiments according to the second, third, fourth and fifth aspects of the invention in accordance with the preferred embodiments of the first aspect of the invention mutatis mutandis (with appropriate changes). The PCB could be any substrate, including a flexible cable.

BRIEF DESCRIPTION OF THE FIGURES

Embodiments of the present invention will be described herein, by way of example only, with reference to the following figures in which:

FIG. 1 shows a photograph plan view of a SIM card reader according to the prior art;

FIG. 4 shows a perspective overview of a SIM card reader according to the present invention;

FIG. 5 shows a detailed plan view of the SIM card reader of FIG. 4;

FIG. 6 shows a cross-section view through lines A-A of the SIM card reader of FIGS. 4 and 5;

FIG. 7 shows a cross-section view of an embodiment of the present invention with a SIM card inserted;

DETAILED DESCRIPTION OF PREFERRED EMBODIMENTS

Figure 2:
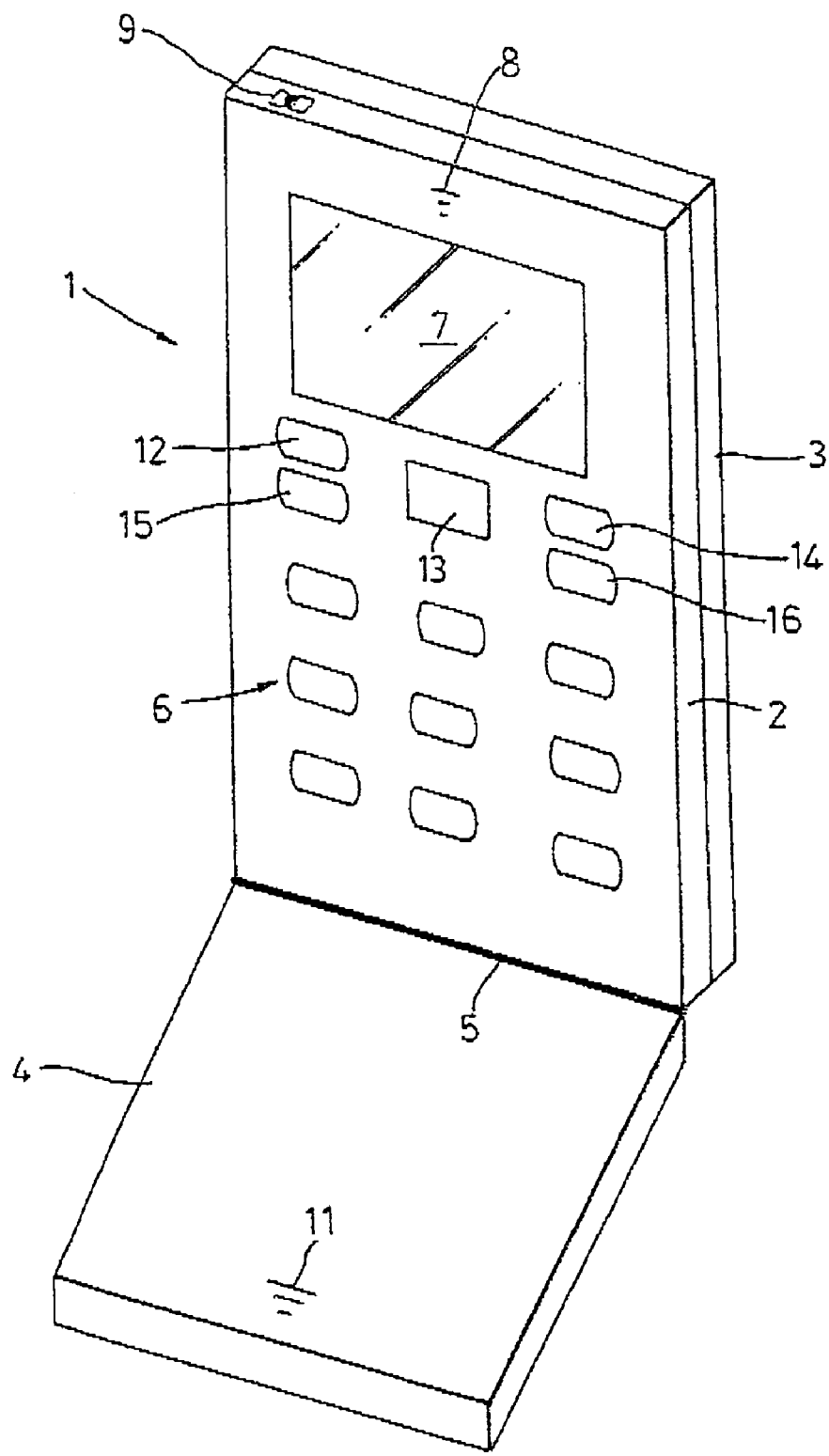
FIG. 2 shows the exterior of a mobile telephone incorporating the present invention.

The exterior details of a mobile telephone 1 are shown in FIG. 2. These details are not central to the claimed invention and are accordingly only discussed briefly. The telephone 1 of FIG. 2 is of a "flip-type" construction and has a front casing portion 2, a rear casing portion 3 and a cover 4 pivotally connected to the front casing portion 2 which is movable between a closed position in which it overlies the casing 2 and an open position in which it extends away from the front casing portion 2. The angle to which the cover 4 extends relative to the casing 2 is dependent on the length of a flexible member 5, formed from a strip of rubber or polymer material joining the front casing 2 to the cover 4.

In FIG. 2, the cover 4 is shown in an almost completely open position. A user interface is provided in the front casing portion 2 and comprises a keypad 6, an electronic display 7, an ear-piece 8, an on/off key 9. A microphone 11 is fitted in the cover 4. The rear casing portion 3 has a removable portion (not shown) to enable internal housing of a memory/IC card e.g. a SIM card and/or memory card. The telephone 1 is adapted to enable communication via a wireless telecommunications network, e.g. a cellular network. However, the telephone 1 could also be designed for a cordless network or any other transmission network.

The keypad 6 has a first group of keys that are alphanumeric to enable a user to enter a telephone number, write a text message (SMS) or enter a name associated with a particular number, etc. The keypad 6 additionally includes five soft keys 12,13,14,15, and 16, which change function depending on the status of the telephone 1. The first soft key 12 is used to access the menu structure and to select a function in the menu. The second soft key 13 is used to scroll up and down in the display 7 whilst a menu is displayed. The third soft key 14 is used to enter the phonebook options when the telephone 1 is in a standby position. However, when in the menu structure, the third soft key 14 is used to close the menu structure or erase entered characters. The fourth and fifth soft keys 15,16 are call-handling keys. The first call-handling key 15 is used to start a call or establish a conference call and the second call-handling key 16 is used to end a conference call or reject an incoming call.

Figure 3:
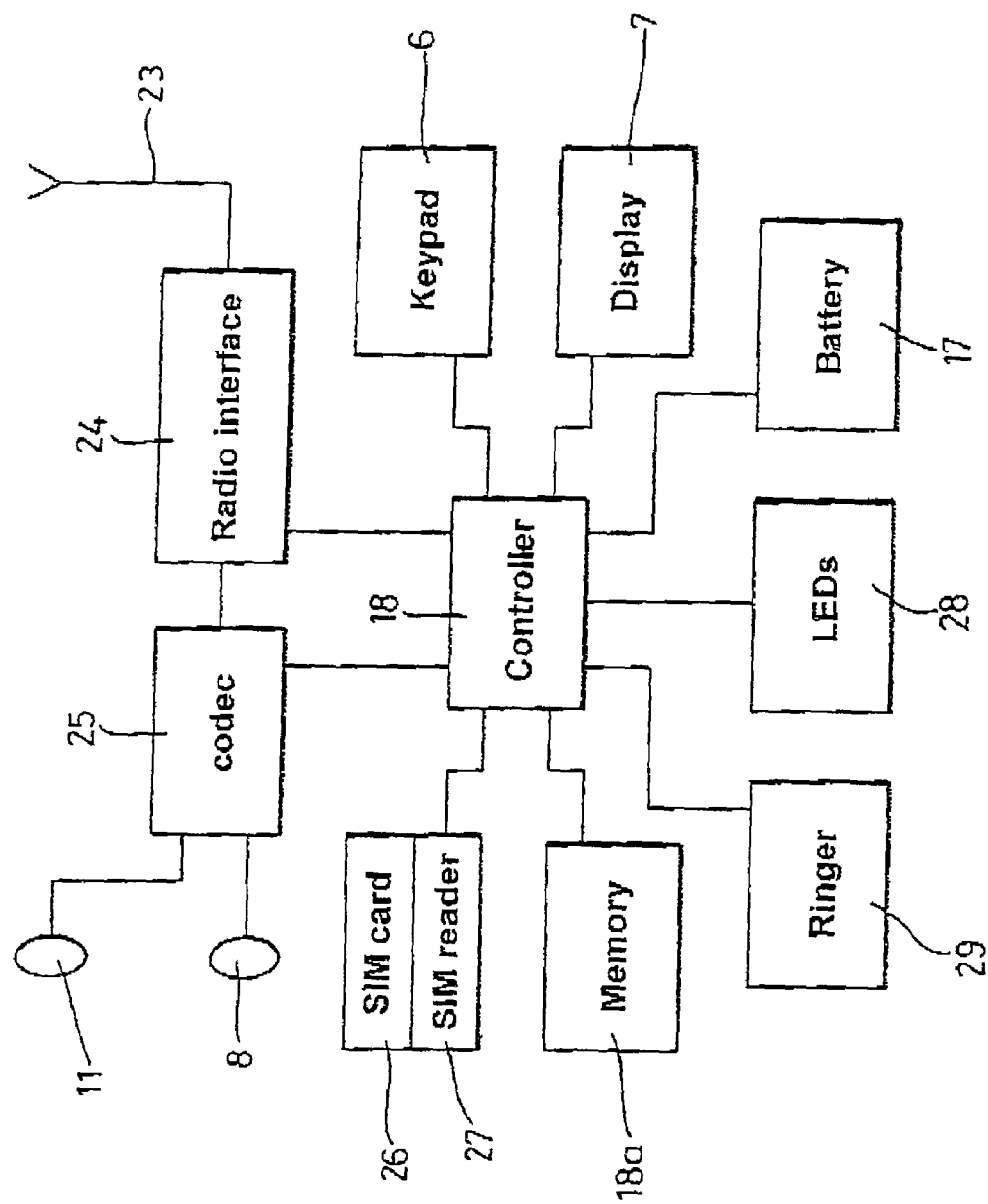
FIG. 3 shows a schematic representation of the electronic components of the mobile telephone illustrated in FIG. 2.

FIG. 3 shows a schematic representation of the main components of the mobile telephone illustrated in FIG. 2. The telephone 1 is powered by a removable battery pack 17. Signal processing is carried out under the control of a digital microcontroller 18 that has an associated RAM/ROM and flash memory 18a. The controller 18 receives instruction signals from the keypad 6 including the soft keys 12,13,14, 15,16 and controls the operation of the display 7. Radio signals are transmitted and received by means of an antenna 23 connected through a radio interface 24 to a codec 25 configured to process signals under control of the controller 18. Thus, in use, for speech the codec 25 receives analogue signals from the microphone 11, digitises them into a form suitable for transmission and feeds them to the radio interface 24 for transmission through antenna element 23 to the public land mobile network (PLMN). Similarly, received signals are fed to codec 25 so as to produce analogue signals that are fed to the ear-piece 8. The telephone 1 also includes a subscriber identification module (SIM) card 26, a SIM card reader 27, light emitting diodes (LEDs) 28 and a ringer 29. The individual circuits and elements are of a type well known in the art, for example, in the Nokia range of mobile telephones.

The present invention provides a modified SIM card connector 200, an embodiment of which is shown in various degrees of detail in FIGS. 4, 5 and 6.

The connector comprises a rectangular housing 201, formed from a non-conductive material, such as liquid crystal polymer. Two sets of three electrical contact pins 202 are each positioned towards either side of a centrally positioned square filter aperture 203 on the upper surface 210 of the housing 201. The electrical contact pins 202 on the upper surface 210 are provided to connect with the pins (not shown) of an appropriately positioned electronic memory card 230 (FIG. 7).

In the cross-section (A-A) of FIG. 6, it can be seen that the electrical contact pins 202 extend out of an upper surface 210 of the housing 201 and protrude out of the lower surface 212 of the housing 201. The upper surface 210 provides a connection end to the electronic memory card. The lower surface 212 provides a connection end to the printed circuit board 220.

Two ground contact stripes 204, formed from a conductive material, are provided on two opposing exterior side surfaces 211 of the housing 201. The ground contact stripes 204 connect with a ground plane (not shown) on the printed circuit board 220. A conductive cover 240 is used to hold the electronic memory card 230 in a connected position with the electrical contact pins 202, and also provides electromagnetic shielding. This is facilitated by the conductive cover 240, which is arranged to engage with the ground contact stripes 204 when the electronic memory card 230 is held in position by the cover 240 (FIG. 7). The cover 240 may slide over the memory card 230 or may be hinged into position (FIG. 7) over the memory card 230.

The shield cover 240 may have a solid conductive structure, or be formed from a conductive mesh. The shield cover 240 may include other electrical small holes/openings which, for example, allow for testing of the connector contact pins without the removal of the shield cover 240.

The shield cover 240 may be formed from the rear surface of the electronic memory card 230. For example, a mesh arrangement on the rear surface of the electronic memory card 230 may be provided so as to make contact with the ground stripes 204 in a correctly oriented position. However, the mesh may be arranged such that the gaps in the mesh overlie the electrical contact pins 202 when the reverse of the electronic memory card is placed in the housing 200 over the connector contacts pins 202. This may avoid causing damage to the electronic memory card 230.

The filter 250 is positioned centrally within the housing aperture 203. The filter comprises a Ball Grid Array arrangement 251 to connect to the printed circuit board 220. Electrical connection between the filter 250 and the connector 200 is made via the printed circuit board 220. Signalling 221 travels within the inner layers of the PCB 220.

The filter is a 3 line EMI filter, of the type obtained from ST Microelectronics (EMIF03-SIM01F2) with a size of about 1.6 mm×1.6 mm, height of 0.65 mm, and is often referred to as a Application Specific Integrated Parts (ASIP) filter. Other filters can be used, and can be of the order of 1.4×1.4 mm or 1.3×1.3 mm. The aperture 203 is preferably approximately 120% the size of the filter 250.

Figure 8:
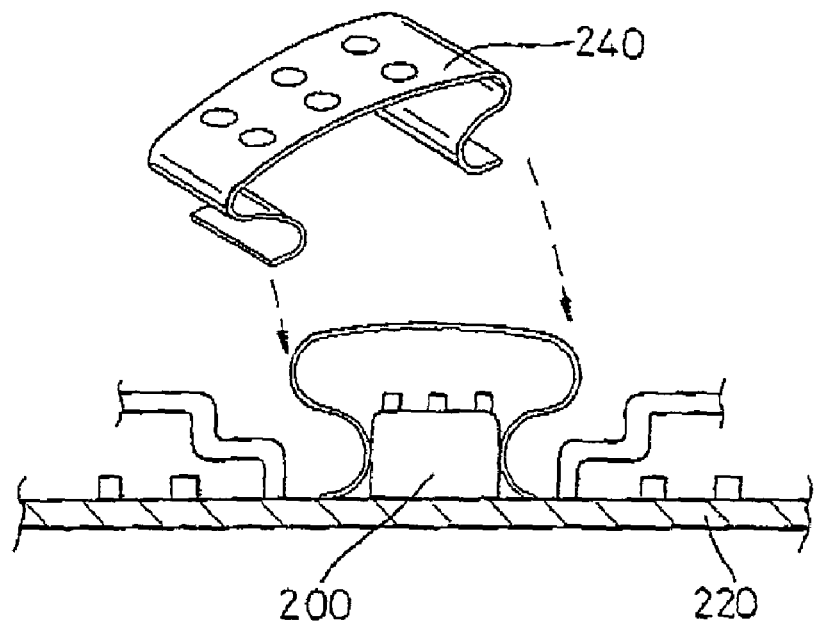
FIG. 8 shows a cross section view of a shield and connector according to the present invention.

The embodiment of FIG. 5 shows two opposing pairs of ground contact stripes 204. However, rather than having a pair of contact stripes only on two opposing sides, ground contacts may be provided on all four sides. Furthermore, a single ground contact may be provided on one or more of the sides. This may extend completely or along a majority of one side. Such an arrangement is shown in FIG. 8.

Rather than having discrete contact stripes, grounding may be provided by a collar which extends continuously around the perimeter of the housing.

Figure 9:
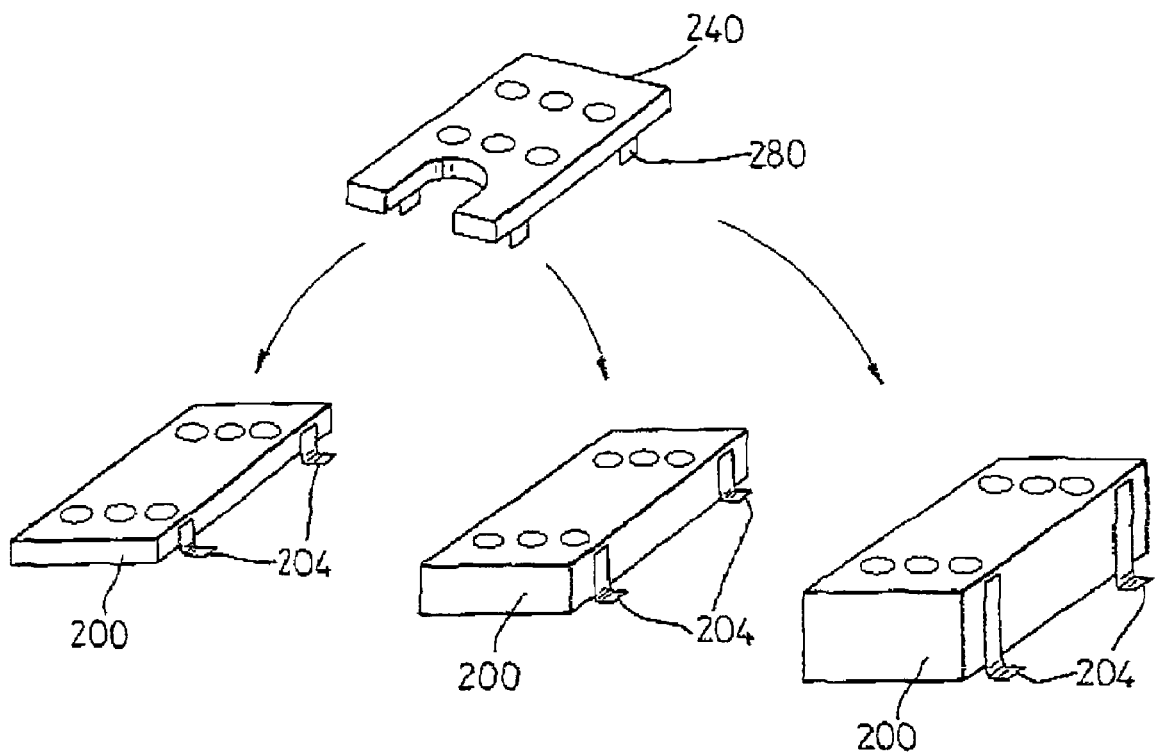
FIG. 9 shows a perspective view of the same shield holder connectable to three connectors each with different heights according to the present invention.

The shielding 240 may be fully detachable from the connector 200. The shielding 240 may be arranged to hold the SIM card for connection with the connector 200. In such a case, the connection end of the shield would have one or more apertures to allow an appropriately positioned SIM card to make contact with the contact pins 202 of the connector 200. The shielding 240 would be arranged to provide connection to one or more of the connector grounds. Such an arrangement is shown in FIG. 9, with the aperture not shown for clarity.

This arrangement allows a standard shield 240 to be used with connectors 200 having differing heights. The ground contact stripes 204 on the connectors 200 and the corresponding contacts 280 on the shield 240 are arranged to make contact to provide grounding. The stripes 204 extend upwards to a sufficient height to allow for connection with the contacts 280 on the shield 240. This may be just below the height of the connector 200 as shown, or nearer the middle or bottom (not shown). Of course, the length of the contacts 280 would be sufficient to make contact with one or more of the stripes 204.

Figure 11:
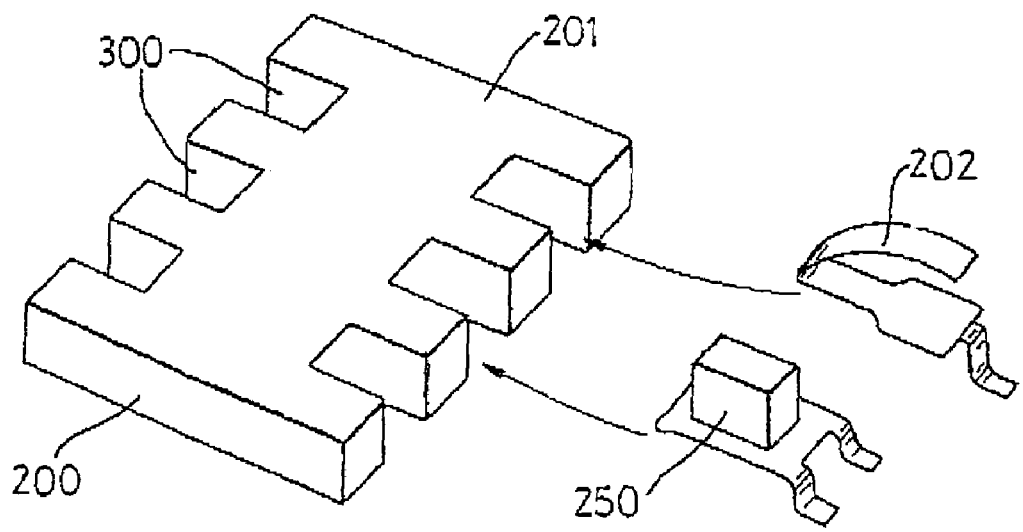
FIGS. 10 and 11 show embodiments of connectors according to the present invention.
Figure 10:
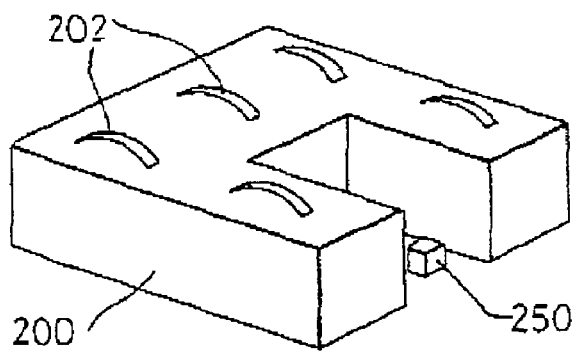

FIGS. 10-11 show various embodiments of connectors according to the present invention. The ground pins or shielding arrangements are not shown.

SIM card connectors ordinarily have 6 contact points. However, only 5 of these are used. Advantageously, the aperture is positioned to replace an unused contact point. Such arrangements are shown in FIGS. 10 and 11.

In FIG. 11, the contact pins 202 are each positioned in pin apertures 300 within the connector housing 201. These contact pins can be slideably fixed into the housing 201. One of the contact pins 202 has an electronic component (e.g. filter) attached onto itself. Two contact legs are provide, one for input, the other for output.

A PCB incorporating a connector according to the present invention may be assembled by a variety of methods. However, the connector is preferably assembled onto a PCB over of an already connected filter. The aperture 203 is then positioned over the filter. The connector may be manoeuvred into position by use of a robot, vacuum pick and place machine. Advantageously, a sticker may be placed over the aperture to allow a vacuum pick and place machine to hold the connector in the position of the aperture. The sticker may be removable and/or transparent. This would be particularly advantageous for large connectors with centrally positioned apertures.

The present invention encompasses one or more embodiments in combination or isolation. It should be noted that variations can be made to the aforementioned embodiments without departing from the scope of the invention.

For example, the surfaces at printed circuit board end and the card connection end are shown to be substantially parallel to one another. This may not be the case, and the surfaces may not be parallel to one another. The connector may be completely or largely cubic, cylindrical or rectanguloid in shape. The aperture is shown to be square but any suitable shape can be used. The dimensions of the aperture/housing may vary according to the filter size (height of the filter may be less than 0.5 mm, length/width of 0.5 mm to 0.4 mm).

Furthermore, it should be noted that the term Printed Circuit Board (PCB) is used to encompass the term Printed Wire Board (PWB), these terms being well known in the art to have interchangeable usage. In general, the connector could provide connection to a substrate, rather than specifically a PCB. In certain embodiments, the substrate could be a PCB and in other embodiments it could be a flexible cable.

The invention claimed is:

1. A pin connector for an electronic component, the connector comprising a non-conductive housing with a substrate end and an electronic component connection end, the housing comprising one or more electrical contacts, the or each electrical contact extending from the substrate end to the component connection end to provide one or more electrical contact points to a substrate at the substrate end and one or more electrical contact points for an electronic component at the component connection end, the housing comprising a filter aperture extending from the component connection end to the substrate end, the aperture dimensioned to house one or more filters in an electrically connected position to provide filtering of signalling between a substrate connected at the substrate end and an electronic component connected at the component connection end, wherein the connector is arranged to provide electromagnetic shielding, the connector comprising one or more conductive shield covers comprising holes in the cover, and wherein the holes are aligned to overlie the component end contact points.

2. A pin connector according to claim 1, wherein the substrate is a printed circuit board.

3. A connector according to claim 1, wherein the housing comprises a plurality of electrical contacts and the aperture is positioned to minimise the distance between any one contact and the or each filter placed within the aperture.

4. A connector according to claim 1, wherein the housing comprises a plurality of electrical contacts and the aperture is positioned to provide an equidistant distance from each of the plurality of electrical contacts and a filter placed in the aperture.

5. A connector according to claim 1, wherein the housing comprises a plurality of electrical contacts arranged in a symmetrical manner, and the aperture is positioned to minimise the distance between the or each filter and each electrical contact.

6. A connector according to claim 1, wherein the housing comprises a plurality of electrical contacts arranged in a symmetrical manner and the aperture is positioned at the centre of the arrangement of electrical contacts.

7. A connector according to claim 1, wherein the aperture is dimensioned to house a single filter, the single filter being arranged to provide filtering to each of the electrical contacts.

8. A connector according to claim 1, wherein the aperture is dimensioned to house one or more filters housed in a single housing, each filter being associated with a pin contact.

9. A connector according to claim 1, wherein the aperture is positioned within a central region of the housing.

10. A connector according to claim 1, wherein the thickness of the housing through which the aperture extends is less than the length and/or width of the housing.

11. A connector according to claim 1, wherein the connector further comprises one or more conductive ground lines, the or each ground line arranged to provide connection from one or more electrically ground positions on a substrate to the component connection end to make contact with the or each conductive shield housing cover.

12. A connector according to claim 1, wherein the connector comprises one or more conductive ground lines, wherein the or each ground line is arranged to provide connection from one or more electrically ground positions on a printed circuit board to the component connection end to make contact with the or each conductive shield housing cover, and wherein the or each conductive shield housing cover is used to place the component into a firm engaged position with the connector component end contact points.

13. A connector according to claim 1, wherein the or each shield cover comprises a conductive grid/mesh arrangement.

14. A connector according to claim 1, wherein the or each shield cover is formed on an exterior surface of the component.

15. A connector according to claim 1, wherein the or each shield cover is provided by a rear portion of an electronic memory card.

16. A pin connector comprising a non-conductive housing with a substrate end and an electronic component connection end,
the housing comprising one or more electrical contacts, the or each electrical contact extending from the substrate end to the component connection end to provide one or more electrical contact points to a substrate at the substrate end and one or more electrical contact points for an electronic component at the component connection end,
the housing comprising a filter aperture extending from the component connection end to the substrate end, the aperture dimensioned to house one or more filters in an electrically connected position to provide filtering of signalling between a substrate connected at the substrate end an electronic component connected at the component connection end
wherein the or each shield cover is provided by a rear portion of a connected electronic component, the rear portion comprising a mesh arranged such that the gaps in the mesh overlie the connector component end contact points.

17. A connector according to claim 1, wherein the connector comprising one or more fully detachable conductive shield covers arranged to connect with one or more ground lines, the or each ground line arranged to provide connection from one or more electrically ground positions on a substrate to the component connection end to make contact with the or each fully detachable conductive shield cover.

18. A connector according to claim 17, wherein the ground line is a collar around the perimeter of the housing.

19. A connector according to claim 17, wherein the or each fully detachable conductive shield cover comprises one or more resiliently biased connection arms to engage with the or each ground line.

20. A connector according to claim 17, wherein the or each fully detachable conductive shield cover comprises an aperture for the insertion of one or more electronic memory cards.

21. A connector according to claim 1, wherein the connector is arranged to connect an electronic memory card to the components of an electronic device on a PCB.

22. A connector according to claim 1, wherein the connector is arranged to connect a SIM card for a mobile phone.

23. A connector according to claim 1, wherein the connector is arranged to connect a memory card of MMC/SD or Memory Stick format.

24. A connector according to claim 1, wherein the connector is arranged to connect a camera module.

25. A printed circuit board comprising a pin connector for an electronic component according to claim 2.

26. An electronic device comprising a connector according to claim 1.

27. An electronic device comprising a printed circuit board, an electronic component and a pin connector according to claim 2.

28. A pin connector according to claim 1, wherein the substrate is a flexible cable.

29. A substrate comprising a pin connector for an electronic component, the pin connector comprising a non-conductive housing with a substrate end and an electronic component connection end, the housing comprising one or more electrical contacts, the or each electrical contact extending from the substrate end to the component connection end to provide one or more electrical contact points for a substrate at the substrate end and one or more electrical contact points for a electronic component at the component connection end, the housing comprising a filter aperture extending from the component connection end to the substrate end, the aperture dimensioned to house one or more filters in an electrically connected position to provide filtering of signalling between a substrate connected at the substrate end and an electronic component connected at the component connection end, wherein the connector is arranged to provide electromagnetic shielding, the connector comprising one or more conductive shield covers comprising holes in the cover, and wherein the holes are aligned to overlie the component end contact points.

30. A connector according to claim 16, wherein the or each shield cover is provided by a rear portion of a connected memory/SIM card, the rear portion comprising a mesh arranged such that the gaps in the mesh overlie the connector component end contact points.

31. A method for assembling a pin connector onto a printed circuit board, the pin connector according to claim 2, the method comprising the steps of:
electrically connecting one or more filters onto a printed circuit board to provide filtering to the electrical contacts of an electronic component, and
assembling the pin connector over the or each filter.

32. A method of assembly according to claim 31, comprising placing a sticker over the filter aperture to allow the connector to be held, using the sticker, over the aperture region.

33. A method for assembling a pin connector onto a substrate, the pin connector according to claim 2, the method comprising the steps of:
electrically connecting one or more filters onto a substrate to provide filtering to the electrical contacts of an electronic component, and
assembling the pin connector over the or each filter.

* * * * *